US006877316B1

(12) United States Patent
Sarkar et al.

(10) Patent No.: US 6,877,316 B1
(45) Date of Patent: Apr. 12, 2005

(54) ELECTRO-THERMAL SCRATCH DRIVE ACTUATOR

(75) Inventors: Niladri Sarkar, Brossard (CA); Aaron Geisberger, Dallas, TX (US); Matthew Ellis, Allen, TX (US)

(73) Assignee: Zyvex Corporation, Richardson, TX (US)

( * ) Notice: Subject to any disclaimer, the term of this patent is extended or adjusted under 35 U.S.C. 154(b) by 0 days.

(21) Appl. No.: 10/719,266

(22) Filed: Nov. 21, 2003

(51) Int. Cl.[7] ................................................ F01B 29/10
(52) U.S. Cl. ............................................ 60/527; 60/528
(58) Field of Search ........................... 60/527, 528, 529

(56) References Cited

U.S. PATENT DOCUMENTS

| 5,781,331 A | * | 7/1998 | Carr et al. .................. 359/288 |
| 5,796,152 A | * | 8/1998 | Carr et al. .................. 257/415 |
| 5,960,132 A | * | 9/1999 | Lin ............................. 385/18 |
| 5,982,554 A | * | 11/1999 | Goldstein et al. ........... 359/629 |
| 6,461,337 B1 | | 10/2002 | Minotti et al. |
| 6,679,055 B1 | * | 1/2004 | Ellis ............................ 60/527 |
| 6,745,567 B1 | * | 6/2004 | Mercanzini ................. 60/527 |

OTHER PUBLICATIONS

Ryan J. Linderman et al., "Optimized Scratch Drive Actuator for Tethered Nanometer Positioning of Chip–Sized Components", NSF Center for Advanced Manufacturing and Packaging of Microwave, Optical and Digital Electronics, University of Colorado at Boulder, CO.
Emmanuel Quevy et al., "Large Stroke Actuation of Continuous Membrane for Adaptive Optics by 3D Self–Assembled Microplates", CIRMM/IIS–CNRS, Institute of Industrial Science, The University of Tokyo, Tokyo, Japan.
Shi–Sheng Lee et al., "MEMS Actuators and Micropositioners for the Integrated Micro–Optics", Electrical Engineering Department, University of California, Los Angeles.

* cited by examiner

Primary Examiner—Hoang Nguyen
(74) Attorney, Agent, or Firm—Haynes and Boone, LLP

(57) ABSTRACT

A scratch drive actuator (SDA) device comprising a drive shoe and an actuator. The drive shoe has a first drive shoe position and a second drive shoe position and is configured to urge a shuttle from a first shuttle position to a second shuttle position. The actuator is coupled to the drive shoe and is configured to expand and contract in response to exposure to thermal energy, wherein the expansion and contraction of the actuator each urge the drive shoe towards a corresponding one of the first and second drive shoe positions.

23 Claims, 6 Drawing Sheets

ELECTRO-THERMAL SCRATCH DRIVE ACTUATOR

BACKGROUND OF THE INVENTION

The present disclosure relates generally to micro-electromechanical devices and, more specifically, to an electro-thermal scratch drive actuator.

Micro-electro-mechanical systems (MEMS) involve the integration of mechanical elements, sensors, actuators and electronics on a common silicon substrate through microfabrication technology. The micro-mechanical components are typically fabricated by selectively etching a silicon wafer and the conductive and insulating layers deposited thereon. Because MEMS devices are manufactured using batch fabrication techniques similar to those used for integrated circuits, unprecedented levels of functionality, reliability and sophistication can be placed on a small silicon chip at a relatively low cost.

The so-called "scratch drive" actuator is one such MEMS device, and is capable of precise, stepwise linear motion. Generally, a scratch drive actuator utilizes a flexible, conductive plate with a small bushing at one end. For example, a buried conductive layer, an insulating layer, a sacrificial layer and two conductive device layers may be successively stacked on a substrate. The bushing may be formed in the first conductive device layer, and the plate may be formed in the second conductive device layer overlying the bushing, such as by conventional photolithographic processes. The actuator may then be "released" by etching or otherwise removing the sacrificial layer, such that the bushing rests on the insulating layer and the plate rests at one end on the bushing and at the other end on the insulating layer. When a voltage is applied between the plate and the buried conductor, the plate buckles towards the substrate, pushing the bushing forward a small distance. When the voltage is removed, asymmetries in the friction between the bushing and the insulating layer result in some degree of "rectification" of motion, producing a net movement of the actuator across the substrate. The cycle can be repeated for continuous, stepwise linear motion.

However, as with all micro-electronic devices, it is desirable to reduce the complexity and overall costs of manufacturing. These goals become increasingly urgent as device scaling continues to drive device dimensions into the nano-scale realm, where feature dimensions delve well into the sub-micron range. One obstacle to achieving such scaling with a scratch drive actuator is the need for two or more conductive layers to fabricate the actuator. Because the bushing must be formed in a second conductive layer separate from the layer in which the plate is formed, limitations in sub-micron manufacturing technology impede scaling of the bushing. That is, while the plate portion of the actuator is large enough to experience some degree of scaling, the bushing is already formed at minimum attainable dimensions, such that further scaling is impractical, if not impossible. In addition, it follows from the general goal of reducing the complexity and costs of manufacturing that it is desirable to reduce the number of layers required in the manufacture of any micro-electronic device.

Moreover, the voltage required to drive the scratch drive actuator far exceeds the operating voltages of existing micro-electronic devices. For example, while most micro-electronic devices are typically powered by operating voltages of 20 volts or less, conventional scratch drive actuators may require up to 150 volts for operation. Few devices incorporating MEMS and other micro-electronic devices have such elevated operating voltages available, and the end-use products incorporating the devices are seldom designed to withstand such high voltages.

Accordingly, what is needed in the art is a scratch drive actuator that addresses the problems discussed above.

SUMMARY OF THE INVENTION

To address the above-discussed deficiencies of the prior art, the present disclosure provides a scratch drive actuator (SDA) device comprising a drive shoe and an actuator. The drive shoe has a first drive shoe position and a second drive shoe position and is configured to urge a shuttle from a first shuttle position towards a second shuttle position. The actuator is coupled to the drive shoe and is configured to expand and contract in response to exposure to thermal energy. The expansion and contraction of the actuator each urge the drive shoe towards a corresponding one of the first and second drive shoe positions.

The present disclosure also provides an SDA system comprising a shuttle, a drive shoe and an actuator. The drive shoe has a first drive shoe position and a second drive shoe position, wherein the drive shoe is biased against the shuttle in at least one of the first and second drive shoe positions. The actuator is coupled to the drive shoe and is configured to expand and contract in response to exposure to thermal energy, wherein the expansion and contraction of the actuator each urge the drive shoe towards a corresponding one of the first and second drive shoe positions, the drive shoe thereby urging the shuttle from a first shuttle position towards a second shuttle position.

A method of manufacturing an SDA system is also provided by the present disclosure. In one embodiment, the method includes providing a substrate having an insulating layer and a conductive layer located over the insulating layer. A shuttle is also formed or otherwise provided over the substrate. A drive shoe is formed from the conductive layer, the drive shoe having a first drive shoe position and a second drive shoe position and configured to urge the shuttle from a first shuttle position towards a second shuttle position. An actuator is also formed from the conductive layer, the actuator being coupled to the drive shoe and configured to expand and contract in response to exposure to thermal energy, wherein the expansion and contraction of the actuator each urge the drive shoe towards a corresponding one of the first and second drive shoe positions. The method also includes removing at least a portion of the insulating layer to release at least a portion of the drive shoe and the actuator.

The present disclosure also introduces an SDA system comprising a shuttle and a plurality of drive shoes. Each of the plurality of drive shoes has a first drive shoe position and a second drive shoe position, wherein at least one of the drive shoes is biased against the shuttle when in at least one of the first and second drive shoe positions. The SDA system also includes a plurality of actuators each coupled to at least one corresponding one of the plurality of drive shoes. Each of the plurality of actuators is configured to expand and contract in response to exposure to thermal energy, wherein each of the expansion and contraction of each of the plurality of actuators urges the at least one corresponding one of the plurality of drive shoes towards one of the first and second drive shoe positions, the at least one corresponding one of the plurality of drive shoes thereby urging the shuttle from a first shuttle position towards a second shuttle position.

In another embodiment of an SDA system constructed according to aspects of the present disclosure, the SDA system includes a shuttle and a drive shoe coupled to the shuttle and having a first drive shoe position and a second drive shoe position. At least in this particular embodiment, the SDA system also includes an actuator configured to expand and contract in response to exposure to thermal energy. The drive shoe is biased against the actuator in at least one of the first and second drive shoe positions. Expansion and contraction of the actuator each urge the drive shoe towards a corresponding one of the first and second drive shoe positions, the drive shoe thereby urging the shuttle from a first shuttle position towards a second shuttle position.

The foregoing has outlined preferred and alternative features of several embodiments so that those skilled in the art may better understand the detailed description that follows. Additional features will be described below that further form the subject of the claims herein. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure.

BRIEF DESCRIPTION OF THE DRAWINGS

The present invention is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings.

DETAILED DESCRIPTION

Figure 1:
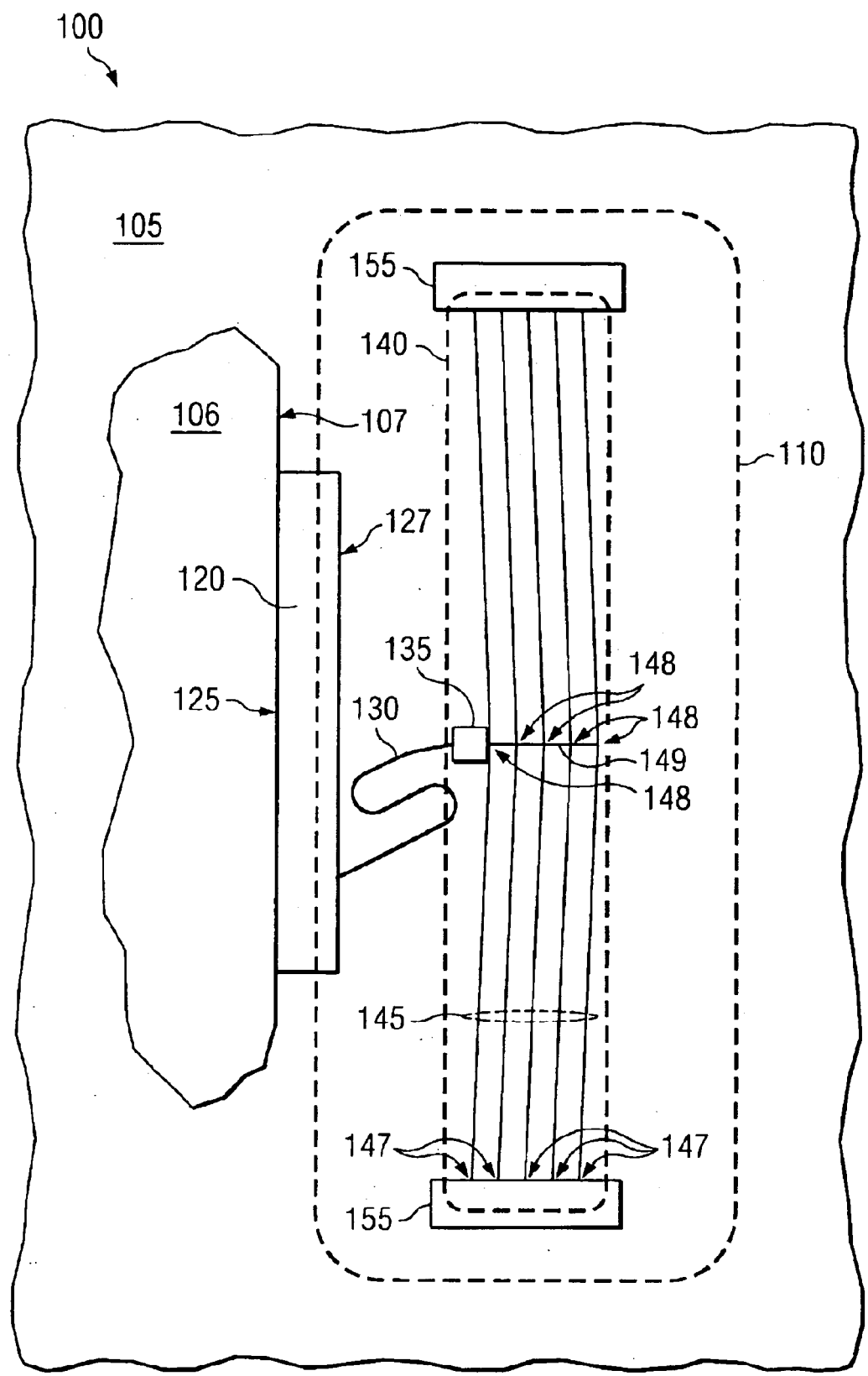
FIG. 1 illustrates a plan view of one embodiment of a scratch drive actuator (SDA) system constructed according to aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a plan view of one embodiment of a scratch drive actuator (SDA) system 100 constructed according to aspects of the present disclosure. The SDA system 100 generally includes an SDA device 110 and a shuttle 120. Although the shuttle 120 contemplates any micro-element that may be physically manipulated by the SDA device 110, the illustrated embodiment represents those that may be laterally translated in response to actuation of the SDA device 110. For example, in the embodiment shown in FIG. 1, the shuttle 120 includes a surface 125 configured to slide laterally across a surface 107 of a substrate 105 and/or an element 106 formed on or from the substrate 105.

The SDA device 110 includes a drive shoe 130 coupled to an actuator 140. In some embodiments, such as those in which the drive shoe 130 and the actuator 140 are formed from the same layer of material, as described below, the drive shoe 130 and the actuator 140 may be co-planar (in a direction parallel to the page in FIG. 1). The drive shoe 130 and the actuator 140 may be directly coupled, such as when they are integrally formed, or they may be indirectly coupled by an interposing member 135.

The drive shoe 130 may be a ribbon-shaped element, possibly having a bi-arcuate or asymmetric profile (herein collectively referred to as a bi-arcuate profile). For example, the drive shoe 130 may have an aspect ratio of at least about 1.5:1, such that the height (in a direction perpendicular to the page in FIG. 1) is greater than the width (in a direction parallel to the page). FIG. 1 also illustrates one example of a bi-arcuate profile of the drive shoe 130 as having two curved sections interposing three linear sections to form an S-shaped profile. Of course, the particular profile of the drive shoe 130 is not limited by the scope of the present disclosure, such that other shapes and profiles of the drive shoe 130 may be employed.

The actuator 140 may include a plurality of actuator members 145 which, as in the illustrated embodiment, may be ribbon-shaped, rectilinear members. The ends 147 of the actuator members 145 may be coupled to the substrate 105 or otherwise fixed, such as through end blocks 155 or other features formed over the substrate 105. As shown in FIG. 1, the actuator members 145 may also be coupled to one another at or near their midpoints 148, perhaps by a spacer member 149. Moreover, the midpoints 148 may have a neutral position that is slightly offset or skewed towards or away from the drive shoe 130 and the shuttle 120. In the illustrated embodiment, the midpoints 148 are skewed away from the drive shoe 130. The purpose of this offset will be described below.

The drive shoe 130 is illustrated in (or near) a biased position. That is, the drive shoe 130 is being urged against a surface 127 of the shuttle 120, due in part to the tension of the actuator members 145. As such, the drive shoe 130 is biased against the shuttle 120 at an angle of about 65°. Of course, as will become evident in the discussion below, the angle between the drive shoe 130 and the shuttle surface 127 may vary widely among applications, perhaps depending on the desired travel increment of the shuttle 120, the mechanical force that the shuttle can withstand and/or the acceptable (or desired) amount of creep by the shuttle 120 in a secondary direction.

Figure 2:
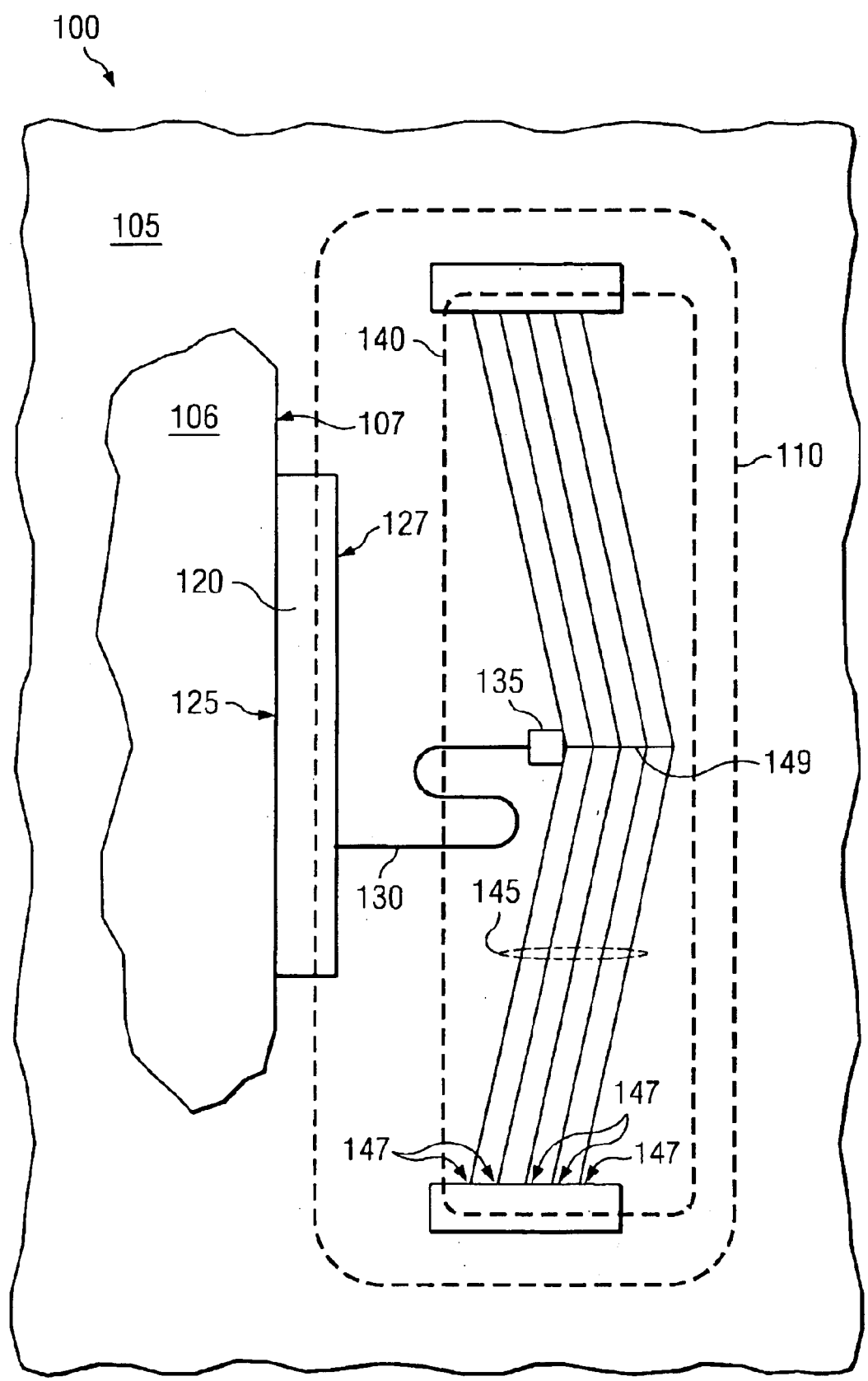
FIG. 2 illustrates a plan view of the SDA system shown in FIG. 1 during one embodiment of operation according to aspects of the present disclosure.

Referring to FIG. 2, illustrated is a plan view of the SDA system 100 shown in FIG. 1 during one embodiment of operation according to aspects of the present disclosure. That is the actuator members 145 are depicted in FIG. 2 as being deflected away from the shuttle 120, such that the drive shoe 130 may rotate towards a second position. In one embodiment, the SDA system 100 may be an electro-static device, wherein the actuator members 145 are deflected in response to a bias applied to the actuator members 145.

However, in a preferred embodiment, the SDA device 110 is an electro-thermal device. That is, the actuator members 145 (and possibly the drive shoe 130) may be configured to expand and contract in response to exposure to thermal energy. Such exposure may be achieved by employing a heat lamp, hot plate or oven. Localized heating may be also achieved with a laser device. In one embodiment, the actuator members 145 are configured to expand and contract in response to thermal energy generated by electrical current propagating along the members 145. As such, the actuator members 145 may be directly or indirectly coupled to bond pads or other means for interconnection with a current or voltage source.

The actuator members 145 expand as they increase in temperature in response to the exposure to thermal energy. Although a variety of thermal expansion schemes are contemplated by the present disclosure (i.e., geometries and corresponding directions of expansion), the illustrated embodiments depict the actuator members 145 as having significantly more length than width or height. Thus, the exposure to thermal energy will cause the actuator members 145 to expand in length more than any other direction. However, because the ends 147 of the actuator members 145 are fixed, the expansion in the length of the actuator members 145 will cause them to buckle, as shown in FIG. 2. Consequently, the actuator spacer 149 will translate laterally. Moreover, because the drive shoe 130 is coupled to the actuator 140 (via one of the actuator members 145, the spacer 149 or otherwise), the drive shoe 130 will be urged towards a second position, as shown in FIG. 2.

In the illustrated embodiment, the second position is a neutral position, wherein the drive shoe 130 is no longer biased against the shuttle 120. However, the expansion of the actuator members 145 need not be to the degree that the drive shoe 130 travels completely to such a neutral position. That is, the actuator members 145 may only be thermally expanded to the degree that the drive shoe 130 travels a portion of the distance to the neutral position. Generally, the actuator members 145 need only be thermally expanded to the degree necessary that the drive shoe 130 travels a sufficient distance that, upon the thermal contraction of the actuator members 145, the friction between the drive shoe 130 and the shuttle 120 be sufficient to cause the shuttle to be repositioned by a desired distance (or, in some embodiments, a desired rotation, as described below). Thus, while the thermal expansion of the actuator members 145 may cause the drive shoe 130 to reach a neutral or unbiased position, all that may be necessary in some applications is that the actuator members 145 be thermally expanded enough to cause the drive shoe 130 to move towards such a neutral position a desired amount. Moreover, the SDA system 100 may be an adjustable system, such that within a single application the degree to which the actuator members 145 are thermally expanded and the drive shoe 130 is moved towards a neutral position is adjustable for each actuation of the SDA actuator 10.

Figure 3:
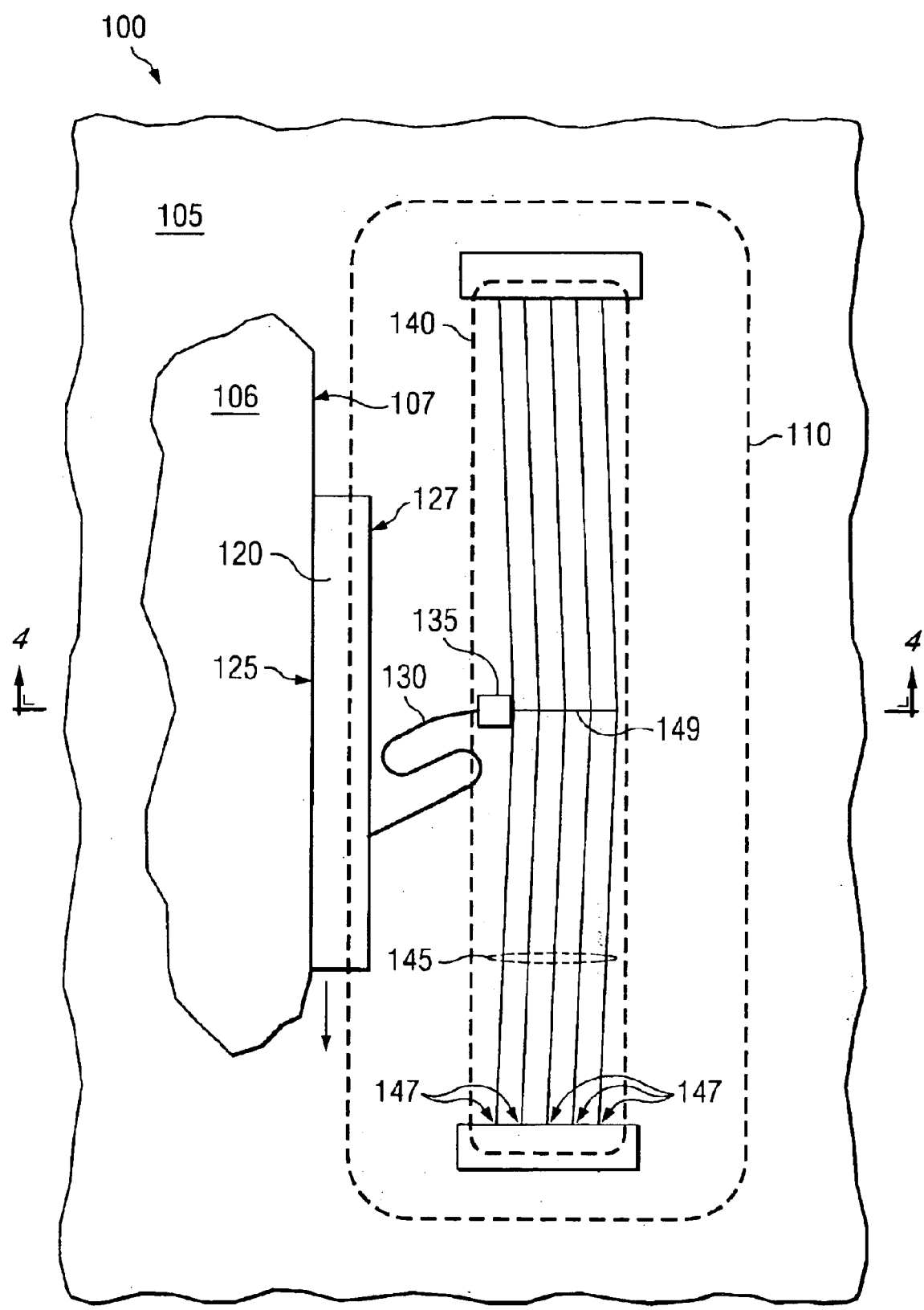
FIG. 3 illustrates a plan view of the SDA system shown in FIG. 2 during a subsequent stage of operation according to aspects of the present disclosure.

Referring to FIG. 3, illustrated is a plan view of the SDA device 100 shown in FIG. 2 in a subsequent stage of operation according to aspects of the present disclosure. After the actuator members 145 have been thermally expanded to a sufficient degree for a particular application, their exposure to thermal energy may be reduced or removed. Consequently, the actuator members 145 may cool and contract back towards their original position (e.g., their position in FIG. 1). The contraction of the actuator members 145 will once again bias the drive shoe 130 against the shuttle 120. However, due to asymmetries in the friction between the drive shoe 130 and the shuttle 120, the contraction of the actuator members 145 will cause the drive shoe 130 to urge the shuttle 120 towards a new position (i.e., away from the position of the shuttle 120 shown in FIG. 1).

The asymmetry in friction between the drive shoe 130 and the shuttle 120 may be due at least partially to the angle at which the drive shoe 130 is biased against the shuttle 120, the shape of the end of the drive shoe 130 interfacing the shuttle 120 and/or the surface roughness or coefficient of friction of the shuttle surface 127. In general, the asymmetry in the friction between the drive shoe 130 and the shuttle 120 may be configured to allow the drive shoe 130 to slide along the shuttle 120 in one direction of movement and also allow the drive shoe 130 to urge the shuttle towards a new position in an opposite direction of movement.

The asymmetry and the direction of deflection of the drive shoe 130 may also be influenced by its profile or shape. For example, the S-shaped or bi-arcuate profile of the drive shoe 130 shown in FIGS. 1–3 enables the drive shoe 130 to flex in a direction away from the point at which it is coupled to the actuator members 145 (e.g., at the member 135) because the force from the contracting actuator members 145 is offset from the point of bias by the shuttle 120 at the interface between the drive shoe 130 and the shuttle surface 127. These offset forces set up a torque arrangement causing the drive shoe 130 to flex in the direction of the offset.

Because the midpoints 148 of the actuator members 145 may all be skewed off-center in the same direction, the actuator members 145 may each buckle in the same direction during expansion. In the illustrated embodiment, the actuator members 145 are skewed away from the shuttle 120 and drive shoe 130, such that expansion of the actuator members 145 pulls the drive shoe 130 along the shuttle 120 towards a second position and contraction of the actuator members 145 urges the shuttle 120 towards a new shuttle position. Accordingly, the shuttle 120 may be engaged by the drive shoe 130 in a power-off condition, because the actuator members 145 may not be expanded in a power-off condition, possibly due to the absence of thermal energy. In another embodiment, the midpoints 148 of the actuator members 145 may be skewed towards the shuttle 120 and drive shoe 130, such that expansion of the actuator members 145 may urge the shuttle 120 to a second position and contraction of the actuator members 145 may pull the drive shoe 130 along the shuttle 120 without substantially urging the shuttle 120 into a new position.

The process of expanding and contracting the actuator members 145 in response to thermal energy to urge the drive shoe 130 between first and second positions, as described above, may be repeated as necessary to position the shuttle 120 in a step-wise manner. As such, those skilled in the art will recognize that the SDA system 100 may be employed as a step motor for accurately positioning a mirror, actuator or other micro-electronic or MEMS device.

An SDA actuator constructed according to aspects of the present disclosure may also require much lower voltage levels for actuation and may have a higher work output per unit volume, at least compared to conventional actuators. For example, the SDA actuator 140 shown in FIGS. 1–3 may require less than about 20 volts to provide sufficient current to the actuator members 145 to cause their expansion and contraction, such that the shuttle 120 may be urged towards a desired position with much less voltage than required by conventional SDA devices. Thus, in general, an SDA actuator constructed according to aspects of the present disclosure may operate at reasonable voltage levels yet produce very impressive amounts of mechanical displacement and force.

Figure 4A:
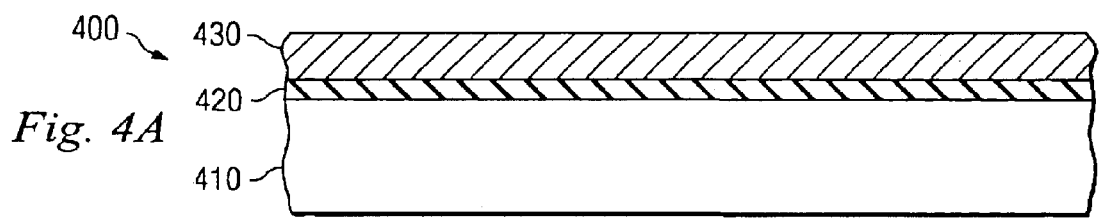
FIGS. 4A–4C illustrate sectional views of one embodiment of a method of manufacturing an SDA system according to aspects of the present disclosure.
Figure 4B:
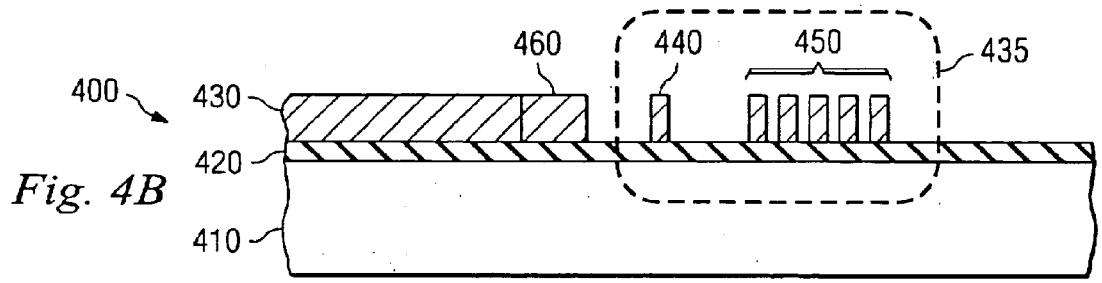
Figure 4C:
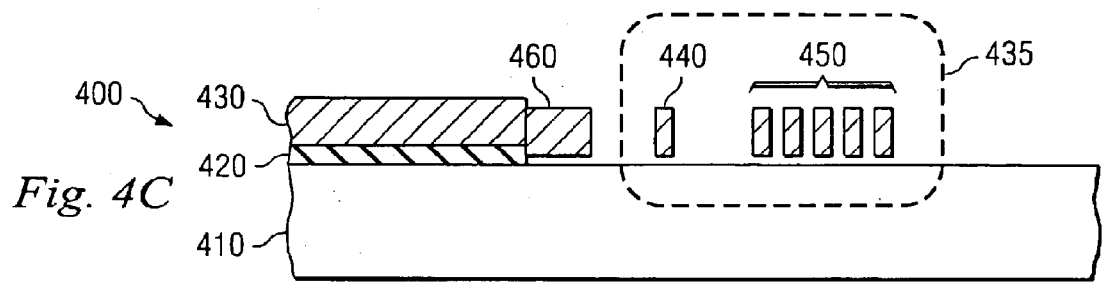

Referring to FIGS. 4A–4C collectively, illustrated are sectional views of one embodiment of a method of manufacturing an SDA system 400 according to aspects of the present disclosure. The sectional view shown in FIG. 4C may be substantially similar to a sectional view indicated in FIG. 3 along the section lines 4—4.

As shown in FIG. 4A, manufacture of the SDA system 400 may begin with the provision of a substrate 410 having an insulating layer 420 and a conductive layer 430 deposited over the substrate 410. The insulating layer 420 may comprise silicon dioxide or other insulating materials, and the conductive layer 430 may comprise polysilicon, single crystal silicon or other conductive materials. Those skilled in the art will recognize that the substrate 410, insulating layer 420 and conductive layer 430 may collectively be a silicon-on-insulator (SOD) substrate.

Referring to FIG. 4B, portions of the conductive layer 430 may be removed to define an SDA actuator 435 (comprising a drive shoe 440 and an SDA actuator 450) and a shuttle 460. Portions of the conductive layer 430 may be removed by plasma or wet etching or other conventional or future-developed processes. The SDA actuator 435 and shuttle 460 may be similar to the SDA actuator 140 and shuttle 120 shown in FIGS. 1–3.

Referring to FIG. 4C, portions of the insulating layer 420 may be removed to release at least portions of the SDA actuator 435 and shuttle 460 from the substrate 410, thereby allowing their movement across the substrate 410, as described above with respect to FIGS. 1–3. The portions of the insulating layer 420 may be removed by plasma or wet etching or other conventional or future-developed processes.

As shown in FIGS. 4A–4C, the SDA actuator 435 may be implemented in a single layer (430) deposited over the substrate 410. That is, the SDA actuator 435 is a vertical device having its members extending vertically over the substrate 410, in contrast to conventional horizontal devices having members extending horizontally across a substrate and requiring multiple layers for construction. Consequently, the manufacture of the SDA actuator 435 may be less complex, time-consuming and costly than the conventional manufacture of step-motors or other SDA actuators.

Figure 5:
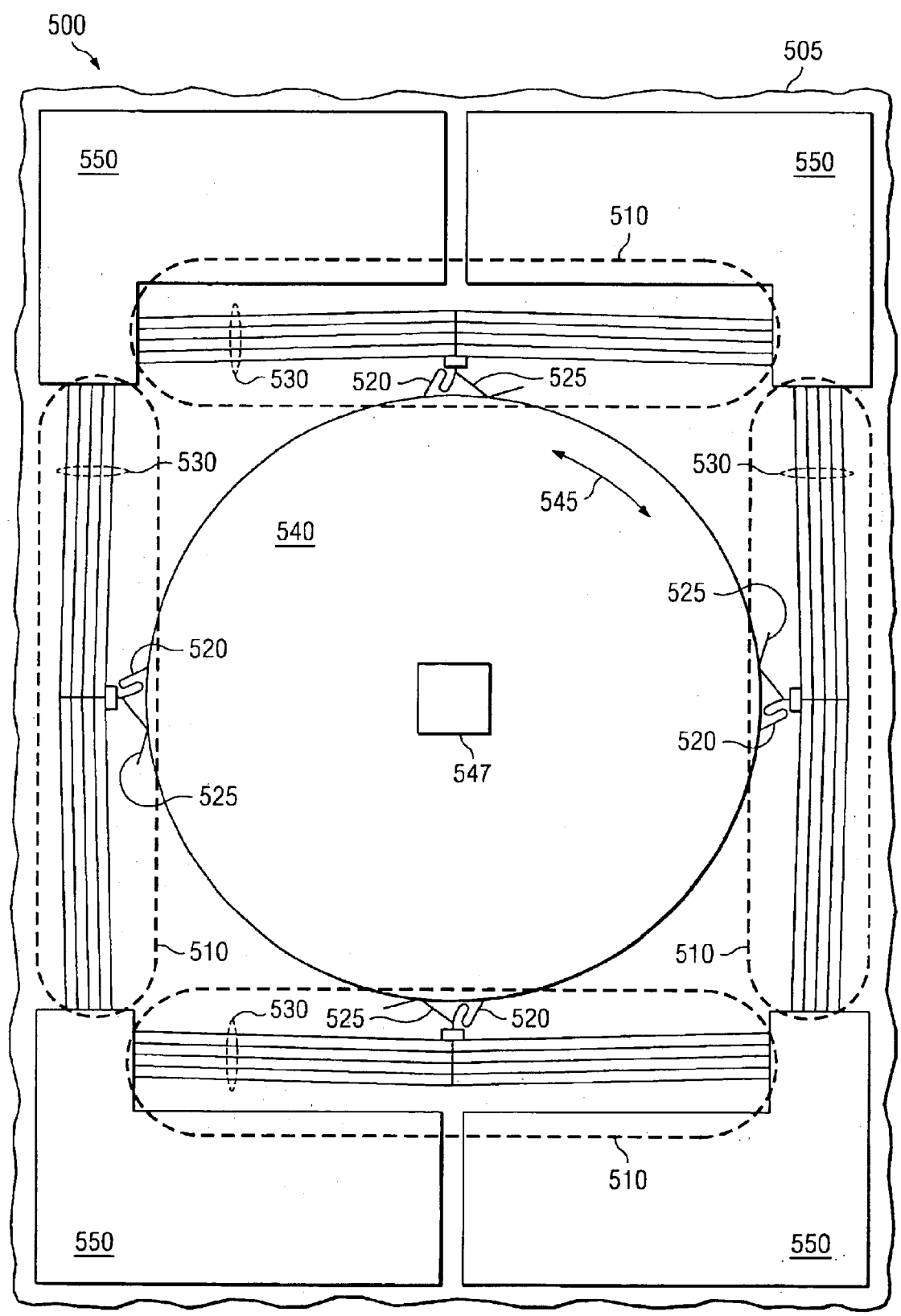
FIG. 5 illustrates a plan view of another embodiment of an SDA system constructed according to aspects of the present disclosure.

Referring to FIG. 5, illustrated is plan view of another embodiment of an SDA system 500 constructed according to aspects of the present disclosure. The SDA system 500 may be one environment in which the SDA system 100 shown in FIGS. 1–3 may be implemented. For example, the SDA system 500 includes a plurality of SDA devices 510 formed over a substrate 505, wherein each of the SDA devices 510 may include a drive shoe 520 and a plurality of SDA actuator members 530. Although not illustrated as such, one or more of the SDA devices 510 may include more than one drive shoe 520, such that multiple drive shoes 520 may be actuated by a common one or group of actuator members 530. The SDA system 500 also includes a shuttle 540, which may have a disc shape, as illustrated, or another shape. Although an SDA system comprising a plurality of SDA devices may be employed to laterally position a shuttle, as illustrated in FIGS. 1–3, the SDA system 500 employs the plurality of SDA devices 510 to incrementally rotate the shuttle 540, as indicated by the arrow 545.

In the illustrated embodiment, two of the SDA devices 510 are configured to rotate the shuttle 540 clockwise, and two of the SDA devices 510 are configured to rotate the shuttle 540 counter-clockwise. Of course, SDA systems within the scope of the present disclosure may have any number of SDA devices. The shuttle 540 may be or comprise a mirror or other microelectronic or MEMS device. The SDA system 500 also includes a plurality of bond or probe pads 550 for interconnection of the SDA devices 510 with an appropriate electrical or thermal source. Of course, the SDA system 500 may include additional and/or alternative means for providing the electrical or thermal energy that may be employed to operate the SDA devices 510 and position the shuttle 540.

FIG. 5 also illustrates another embodiment of the drive shoe 130 shown in FIGS. 1–3. That is, the drive shoes 520 shown in FIG. 5 each include a drive brake 525. The drive brakes 525 are configured to be biased against the shuttle 540 under certain operating conditions to retard or restrict movement of the shuttle 540 and/or to retain the shuttle in a particular position when the shuttle 540 is not being positioned. In such embodiments, operation of the SDA system 500 may include actuating one or more of the SDA devices 510 to release the shuttle 540 or to decrease the restriction of movement of the shuttle 540 when the shuttle 540 is being positioned. Such release or decrease of restriction may be achieved by delivering the appropriate electronic signals to the bond pads 550 or other electrical or thermal energy source. The drive brakes 525 may be formed integral to the drive shoes 520, such as from the same polysilicon of other conductive material layer.

The shuttle 540 may be defined in the same conductive layer from which the actuator devices 510 are formed. However, the shuttle 540 may also be a discrete element assembled into the SDA system 500. Accordingly, the shuttle 540 may include engagement means 547 for receiving a gripper or other tool for placing the shuttle 540 into the SDA system 500.

Figure 6:
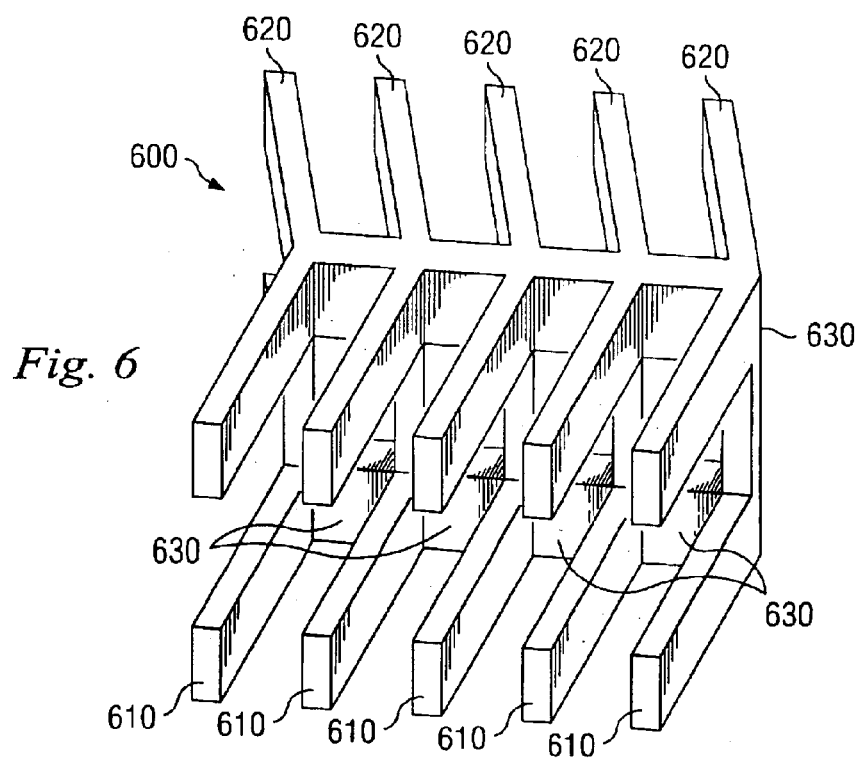
FIG. 6 illustrates a perspective view of one embodiment of an SDA actuator member constructed according to aspects of the present disclosure.

Referring to FIG. 6, illustrated is a perspective view of one embodiment of an SDA actuator member 600 constructed according to aspects of the present disclosure. The actuator member 600 may be similar in composition and manufacture to the actuator members 145 shown in FIGS. 1–3 and the actuator members 450 shown in FIG. 4. However, whereas the actuator members 145, 450 may be described above as being formed from a single layer of polysilicon or other conductive material, the actuator member 600 of FIG. 6 may be formed from multiple layers. For example, the actuator member 600 may include a plurality of first expansion members 610 and a plurality of second expansion members 620. The first expansion members 610 may be formed from a first polysilicon or other conductive material layer and the second expansion members 620 may be formed from a second conductive layer. The first and second expansion members 610, 620 may be mechanically, electrically and or thermally coupled by a plurality of posts 630. In one embodiment, the posts 630 may be or comprise conductive vias. In another embodiment, the posts 630 may be formed from the same layer from which the first expansion members 610 are formed.

By providing multiple layers of expansion members 610, 620, the actuator member 600 may provide greater mechanical force compared to single-layered actuator members upon their expansion in response to exposure to thermal energy. Of course, the number of layers in which expansion members may be formed is not limited to the one- or two-layered embodiments illustrated herein, and each layer of expansion members may also include more or fewer expansion members than those illustrated herein. Those skilled in the art will also recognize that the actuator member 600 may be readily implemented in the embodiments shown in FIGS. 1–5.

Figure 7:
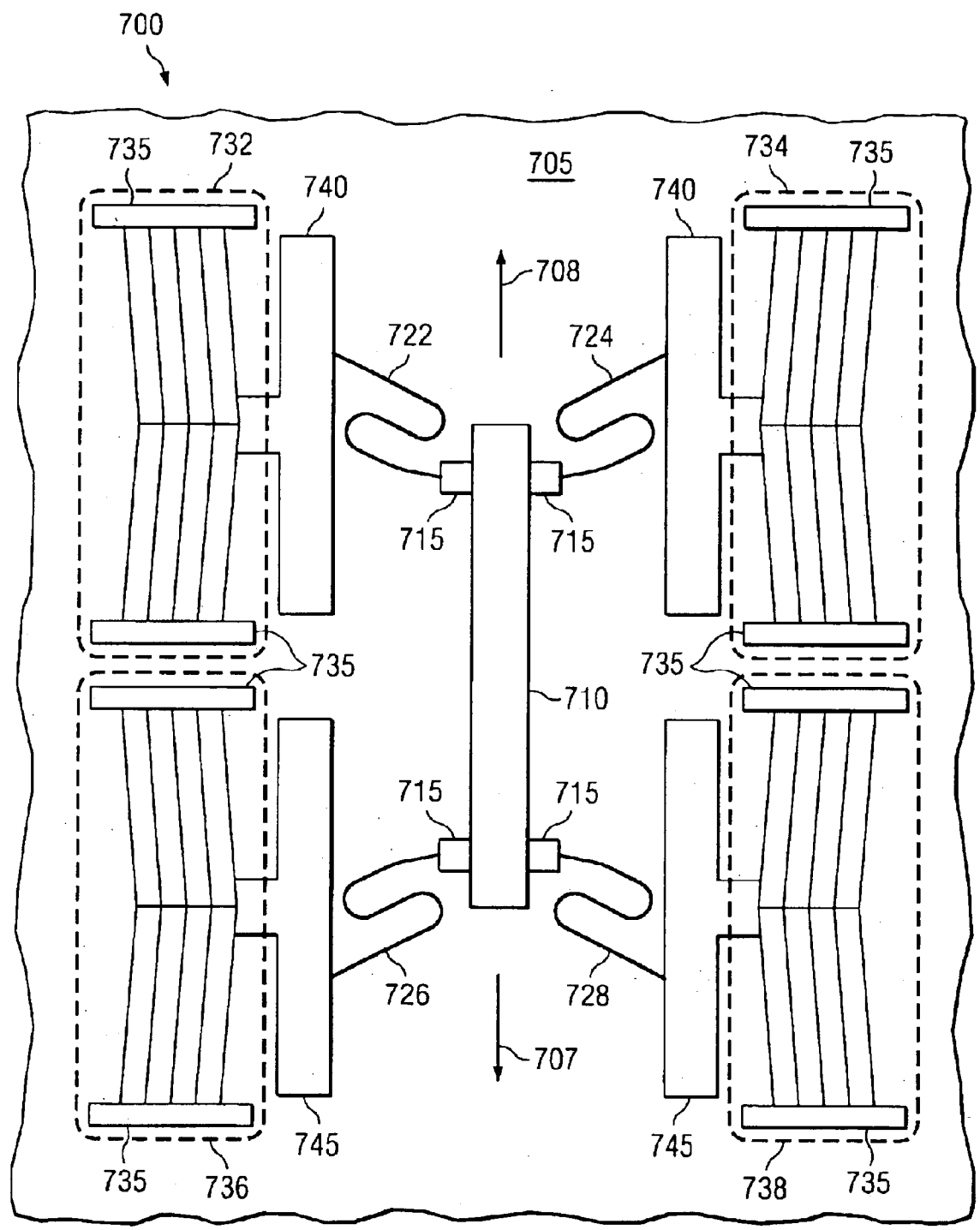
FIG. 7 illustrates a plan view of another embodiment of an SDA system constructed according to aspects of the present disclosure.

Referring to FIG. 7, illustrated is a plan view of another embodiment of an SDA system 700 constructed according to aspects of the present disclosure. The SDA system 700 includes a shuttle 710 configured to slide laterally across a surface of a substrate 705. The SDA system 700 also includes a plurality of drive shoes 722, 724, 726, 728 coupled to the shuttle 710. The drive shoes 722, 724, 726, 728 and the shuttle 710 may be co-planar (in a direction parallel to the page in FIG. 7). The drive shoes 722, 724, 726, 728 and the shuttle 710 may be directly coupled, such as when they are integrally formed, or the drive shoes 722, 724, 726, 728 may be indirectly coupled to the shuttle 710 by interposing members 715.

The drive shoes 722, 724, 726, 728 may each comprise a ribbon-shaped element, possibly having a bi-arcuate profile, including a profile having two curved sections interposing three linear sections to form an S-shaped profile. Of course, the particular profiles of the drive shoes 722, 724, 726, 728 are not limited by the scope of the present disclosure, such that other shapes and profiles of the drive shoes 722, 724, 726, 728 may be employed. Moreover, each of the drive shoes 722, 724, 726, 728 may not have identical or even similar profiles in all embodiments.

The SDA system 700 also includes a plurality of actuators 732, 734, 736, 738. In one embodiment, the SDA system 700 may include one actuator for each of the drive shoes. In other embodiments, the SDA system 700 may include twice as many actuators as drive shoes, or twice as many drive shoes as actuators. In general, the quantitative relationship between the actuators 732, 734, 736, 738 and the drive shoes 722, 724, 726, 728 is not limited by the scope of the present disclosure. The actuators 732, 734, 736, 738 may be similar to those employed in embodiments discussed above, such as the actuators 140 of FIG. 1.

However, whereas the actuators 140 of FIG. 1 may be "power-off engaged" actuators, the actuators 732, 734, 736, 738 of FIG. 7 may be "power-on engaged" actuators. That is, the actuators 732, 734, 736, 738 may not engage the shuttle 710 and, therefore, prevent translation of the shuttle 710, unless the SDA system 700 is in a power-on condition. Of course, the actuators 732, 734, 736, 738 of FIG. 7 may also be "power-off engaged" actuators within the scope of the present disclosure, wherein the actuators 732, 734, 736, 738 may prevent or restrict translation of the shuttle 710 when the SDA system 700 is in a power-off condition. Moreover, in some embodiments, the plurality of actuators 732, 734, 736, 738 may include both "power-off engaged" actuators and "power-on engaged" actuators. The actuators 732, 734, 736, 738 may be coupled to the substrate 705 or otherwise fixed, such as through end blocks 735 or other features formed on or over the substrate 705. As shown in FIG. 7, each of the actuators 732, 734, 736, 738 may also include actuator slides 740, 745 translatable or rotatable across the substrate 705 in response to actuation of the actuators 732, 734, 736, 738.

During one embodiment of operation according to aspects of the present disclosure, two of the actuators 732, 734 may be deflected towards the shuttle 710, possibly in response to exposure to electrical and/or thermal energy, as discussed above. In response, the corresponding drive shoes 722, 724 will engage the actuator slides 740 and rotate towards second positions (clockwise for the drive shoe 722, counter-clockwise for the drive shoe 724). The rotation of the drive shoes 722, 724 will urge the shuttle 710 towards a second position in the direction of the arrow 707. Possibly due to the shape of the drive shoes 726, 728 and/or the actuators 736, 738 possibly not being actuated, the drive shoes 726, 728 may not engage the actuator slides 745 when the actuators 732, 734, 736, 738 are actuated, such that the drive shoes 726, 728 may merely be in sliding contact with the actuator slides 745.

When the actuators 734, 736 are removed from the exposure to thermal energy, the drive shoes 722, 724 may again move towards their first positions (shown in FIG. 7). However, possibly due to the shape of the drive shoes 726, 728, the drive shoes 726, 728 may engage the actuator slides 745, such that the shuttle 710 may remain in the second position as the drive shoes 722, 724 return to their first positions. Alternatively, or additionally, possibly due to the shape of the drive shoes 722, 724, the drive shoes 722, 724 returning to their first positions will not engage the actuator slides 740, but will be in sliding contact with the actuator slides 740 such that the drive shoes 722, 724 will not urge the shuttle 710 back to its first position. This process may be repeated, exposing the actuators 732, 734 to thermal energy and subsequently removing them from the thermal energy, to translate the shuttle 710 across the substrate 705 in a step-wise manner in the direction of the arrow 707. Similarly, the actuators 736, 738 may be exposed to thermal energy and subsequently removed from the exposure to translate the shuttle 710 across the substrate 705 in the direction of the arrow 708. Thus, embodiments constructed according to aspects of the present disclosure may employ drive shoes coupled to actuators to move an element, as described in embodiments shown in FIGS. 1–6, and may also or alternatively employ drive shoes coupled to the element being moved, as shown in FIG. 7.

Although embodiments of the present disclosure have been described in detail, those skilled in the art should understand that they can make various changes, substitutions and alterations herein without departing from the spirit and scope of the present disclosure.

What is claimed is:

1. A scratch drive actuator (SDA) device, comprising:
   a drive shoe having a first drive shoe position and a second drive shoe position and configured to urge a shuttle from a first shuttle position towards a second shuttle position; and
   an actuator coupled to the drive shoe and configured to expand and contract in response to exposure to thermal energy, wherein the expansion and contraction of the actuator each urge the drive shoe towards one of the first and second drive shoe positions.

2. The SDA device of claim 1 wherein the drive shoe and the actuator are substantially co-planar.

3. The SDA device of claim 1 wherein one of the first and second drive shoe positions is a neutral position.

4. The SDA device of claim 1 wherein at least one of the drive shoe and the actuator has an aspect ratio of at least about 1.5:1.

5. The SDA device of claim 1 wherein the actuator and the drive shoe are integrally formed.

6. The SDA device of claim 1 wherein the actuator comprises a plurality of ribbon-shaped rectilinear members each fixed at both ends.

7. The SDA device of claim 1 wherein the drive shoe comprises a ribbon-shaped member having a bi-arcuate profile.

8. The SDA device of claim 1 wherein the drive shoe comprises a brake shoe configured to restrict motion of the shuttle.

9. A scratch drive actuator (SDA) system, comprising:
a shuttle;
a drive shoe having a first drive shoe position and a second drive shoe position, wherein the drive shoe is biased against the shuttle in at least one of the first and second drive shoe positions; and
an actuator coupled to the drive shoe and configured to expand and contract in response to exposure to thermal energy, wherein the expansion and contraction of the actuator each urge the drive shoe towards a corresponding one of the first and second drive shoe positions, the drive shoe thereby urging the shuttle from a first shuttle position towards a second shuttle position.

10. The SDA system of claim 9 wherein the drive shoe urges the shuttle to rotate from the first shuttle position towards the second shuttle position.

11. The SDA system of claim 9 wherein the drive shoe urges the shuttle to translate from the first shuttle position towards the second shuttle position.

12. The SDA system of claim 9 wherein the expansion of the actuator corresponds to the drive shoe urging the shuttle towards the second shuttle position.

13. The SDA system of claim 9 wherein the contraction of the actuator corresponds to the drive shoe urging the shuttle towards the second shuttle position.

14. The SDA system of claim 9 wherein the drive shoe and the actuator are substantially co-planar.

15. The SDA system of claim 9 wherein the drive shoe engages the shuttle in the absence of the thermal energy.

16. The SDA system of claim 9 wherein the actuator is conductive and the thermal energy results from current flow through the actuator.

17. The SDA system of claim 9 wherein the drive shoe and the actuator are integral to a substrate and the shuttle is discrete from the substrate.

18. A method of manufacturing a scratch drive actuator (SDA) system, comprising:
providing a substrate having an insulating layer and a conductive layer located over the insulating layer;
providing a shuttle over the substrate;
forming a drive shoe from the conductive layer, the drive shoe having a first drive shoe position and a second drive shoe position and configured to urge the shuttle from a first shuttle position towards a second shuttle position;
forming an actuator from the conductive layer, the actuator being coupled to the drive shoe and configured to expand and contract in response to exposure to thermal energy, wherein the expansion and contraction of the actuator each urge the drive shoe towards a corresponding one of the first and second drive shoe positions; and
removing at least a portion of the insulating layer to release at least portions of the drive shoe and the actuator.

19. The method of claim 18 wherein the shuttle is formed from the conductive layer.

20. The method of claim 18 wherein the shuttle is a discrete member assembled into the SDA system.

21. A scratch drive actuator (SDA) system, comprising:
a shuttle;
a plurality of drive shoes each having a first drive shoe position and a second drive shoe position, wherein at least one of the drive shoes is biased against the shuttle when in at least one of the first and second drive shoe positions; and
a plurality of actuators each coupled to a corresponding one of the plurality of drive shoes and each configured to expand and contract in response to exposure to thermal energy, wherein each of the expansion and contraction of each of the plurality of actuators urges the corresponding one of the plurality of drive shoes towards one of the first and second drive shoe positions, the corresponding one of the plurality of drive shoes thereby urging the shuttle from a first shuttle position towards a second shuttle position.

22. The SDA system of claim 21 wherein at least one of the plurality of actuators is coupled to at least two corresponding ones of the plurality of drive shoes.

23. A scratch drive actuator (SDA) system, comprising:
a shuttle;
a drive shoe coupled to the shuttle and having a first drive shoe position and a second drive shoe position; and
an actuator configured to expand and contract in response to exposure to thermal energy, wherein the drive shoe is biased against the actuator in at least one of the first and second drive shoe positions, and wherein the expansion and contraction of the actuator each urge the drive shoe towards a corresponding one of the first and second drive shoe positions, the drive shoe thereby urging the shuttle from a first shuttle position towards a second shuttle position.

* * * * *

UNITED STATES PATENT AND TRADEMARK OFFICE
CERTIFICATE OF CORRECTION

PATENT NO. : 6,877,316 B1
DATED : April 12, 2005
INVENTOR(S) : Sarkar et al.

It is certified that error appears in the above-identified patent and that said Letters Patent is hereby corrected as shown below:

Column 5,
Line 3, please correct the numeral "10" to read -- 110 --.

Column 7,
Line 21, please correct the reference to "4--4" to read -- 4-4 --.
Line 31, please correct "(SOD)" to read -- (SOI) --.

Signed and Sealed this

Fifth Day of July, 2005

JON W. DUDAS
*Director of the United States Patent and Trademark Office*